United States Patent [19]

Chisholm

[11] Patent Number: 5,560,802
[45] Date of Patent: Oct. 1, 1996

[54] SELECTIVE CMP OF IN-SITU DEPOSITED MULTILAYER FILMS TO ENHANCE NONPLANAR STEP HEIGHT REDUCTION

[75] Inventor: Michael F. Chisholm, Plano, Tex.

[73] Assignee: Texas Instruments Incorporated, Dallas, Tex.

[21] Appl. No.: 397,802

[22] Filed: Mar. 3, 1995

[51] Int. Cl.$^6$ .................................................. H01L 21/00
[52] U.S. Cl. .................... 156/636.1; 156/652.1; 156/655.1; 156/653.1; 156/657.1; 437/228
[58] Field of Search ............................ 156/636.1, 657.1, 156/652.1, 653.1, 655.1; 437/228; 216/38

[56] References Cited

U.S. PATENT DOCUMENTS

| | | | |
|---|---|---|---|
| 4,708,770 | 11/1987 | Pasch | 156/657.1 X |
| 5,169,491 | 12/1992 | Doan | 156/636.1 |
| 5,272,117 | 12/1993 | Roth et al. | 437/228 |
| 5,290,396 | 3/1994 | Schoenborn et al. | 156/636.1 |
| 5,395,801 | 3/1995 | Doan et al. | 156/636.1 X |

*Primary Examiner*—Thi Dang
*Attorney, Agent, or Firm*—Jacqueline J. Garner; Wade James Brady, III; Richard L. Donaldson

[57] ABSTRACT

A structure and method for chemical-mechanical polishing of a semiconductor body (100) having topographical steps (102) on a surface thereof. A first film (104) having a first CMP removal rate is deposited over the surface of a semiconductor body (100). A second film (106) having a second CMP removal rate is deposited over the first film (104). The second removal rate is not equal to the first removal rate. CMP is performed on the semiconductor body (100) such that the first film (104) is initially exposed only over the topographical steps (102). CMP continues until the semiconductor body (100) has a planarized surface. Because one of the films (104, 106) has a high removal rate and the other (106, 104) has a low removal rate, a CMP process is provided requiring less time and having better process uniformity and process latitude.

14 Claims, 4 Drawing Sheets

SELECTIVE CMP OF IN-SITU DEPOSITED MULTILAYER FILMS TO ENHANCE NONPLANAR STEP HEIGHT REDUCTION

CROSS-REFERENCE TO RELATED APPLICATIONS

The following co-assigned patent applications are hereby incorporated herein by reference:

| Ser. No. | Filing Date | Title |
| --- | --- | --- |
| 08/397,811 | 03/03/95 | Tailoring Chem-Mechanical Polishing of Films by Changing the Stress of the Films to be Polished |
| 08/209,816 | 03/11/94 | Novel Non-Abrasive Conditioning Technique for Pad Conditioning Used in Chemical-Mechanical Polishing, now abandoned |

FIELD OF THE INVENTION

This invention relates generally to semiconductor processing and more specifically to chemical-mechanical polishing of semiconductor devices.

BACKGROUND OF THE INVENTION

As circuit dimensions shrink the need for fine-line lithography becomes more critical and the requirements for planarizing topography becomes very severe. Major U.S. semiconductor companies are actively pursuing Chemical-Mechanical Polishing (CMP) as the planarization technique used in the sub-half micron generation of chips. CMP is used for planarizing bare silicon wafers, interlevel dielectrics, and other materials. CMP machines, such as the one shown in FIG. 1, use orbital, circular, lapping motions to planarize a film on wafer 16. The wafer 16 is held on a rotating carrier 18 while the face of the wafer 16 being polished is pressed against a resilient polishing pad 14 attached to a rotating platen disk 12. A slurry is used to chemically attack the wafer surface to make the surface more easily removed by mechanical abrasion of the pad 14.

In a standard CMP process, topographical steps on the surface of a wafer are polished flat so that the surface of the wafer is very planar. This is illustrated in FIG. 2. Typically, a single layer of silicon dioxide 30 is deposited over the underlying topography 32 (usually metal lines). The polish rate is constant throughout the thickness of the film, however, the polish rate on top of the steps 28a–b are higher due to higher pressure on those areas. The mechanical component in CMP follows the law, P=F/A (pressure equals force divided by area). Since the force is constant in CMP, pressure varies with that area in which the polishing pad 14 contacts the surface of the wafer 16. Accordingly, more of layer 30 is removed over a narrow step 28a, than over a wide step 28b and more of layer 30 is removed over wide step 28b than over the field areas 34.

One of the major costs of running CMP is the low throughput of current CMP processes. In typical semiconductor fabrication equipment, a throughput of 20–30 wafers per hour is considered good. The higher the throughput, the lower the cost of running a process becomes if the other factors remain constant. Currently, in a standard oxide CMP planarization processes, the throughput is only 6–12 wafers per hour. This low throughput is considered one of the major drawbacks of CMP. Accordingly, there is a need for reducing the CMP polishing time.

SUMMARY OF THE INVENTION

A method for chemical-mechanical polishing (CMP) of a deposited multilayer Film to enhance nonplanar step height reduction is disclosed herein. A first film of the multilayer film having a first removal rate is deposited on the surface of a semiconductor body having steps and field areas. A second film of the multilayer film having a second removal rate is deposited on the first film. The first removal rate is not equal to the second. The structure is then chemically-mechanically polished to planarize the structure. As is typical with CMP processes, the second film covering the steps is removed faster than in the field. Thus, the first film is initially reached over the steps. CMP continues removing the first film over the steps and the second film in the field. As a result, the structure is planarized in less time.

An advantage of the invention is providing a CMP method that reduces the CMP polishing time over prior art methods.

Another advantage of the invention is providing a CMP method that is uniform and repeatable.

These and other advantages will be apparent to those skilled in the art having reference to the specification in conjunction with the drawings.

BRIEF DESCRIPTION OF THE DRAWINGS in the drawings.

Figure 6:
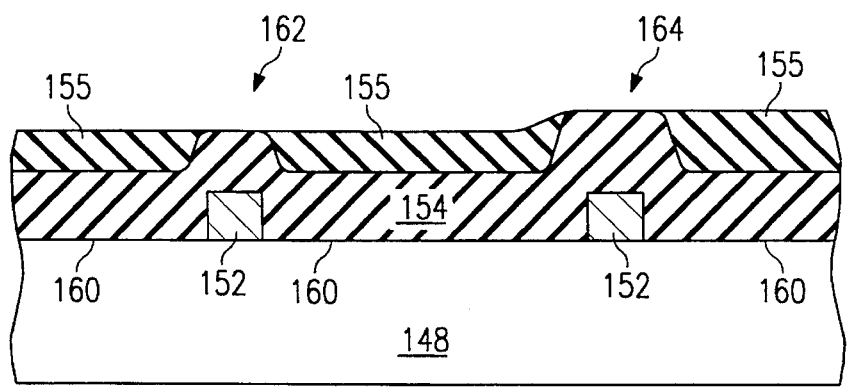
Figure 4A:
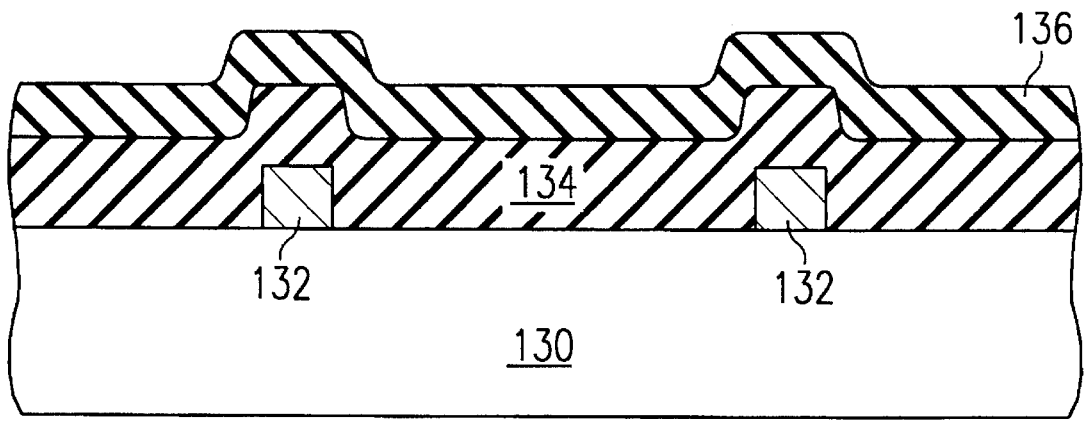
Figure 4B:
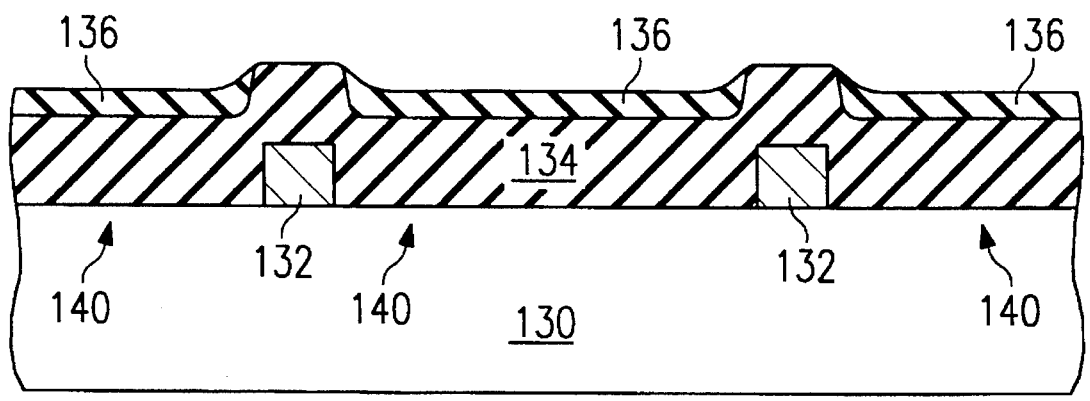
Figure 4C:
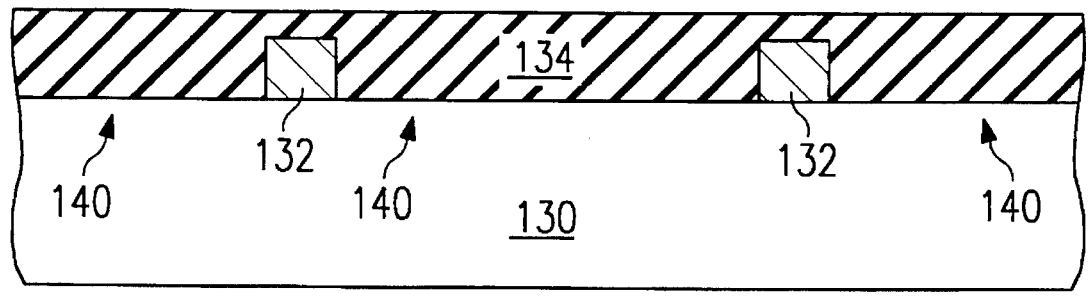

FIGS. 3a–d are cross-sectional diagrams illustrating a first embodiment of a CMP process according to the invention;

FIGS. 4a–c are cross-sectional diagrams illustrating a second embodiment of a CMP process according to the invention;

FIGS. 5a–d are cross-sectional diagrams illustrating a third embodiment of a CMP process according to the invention;

FIG. 6 is a cross-sectional diagram illustrating non-uniformly CMP polished wafer to which the invention is applicable.

Corresponding numerals and symbols in the different figures refer to corresponding parts unless otherwise indicated.

DETAILED DESCRIPTION OF PREFERRED EMBODIMENTS

The invention will be described in conjunction with chemical-mechanical polishing (CMP) of a multilayer film on a semiconductor wafer. The major emphasis of CMP today is for planarizing interlevel dielectrics on a semiconductor wafer. However, other uses are also possible such as, planarizing bare silicon wafers. The invention is equally applicable to these uses.

CMP involves both chemical and mechanical abrasion. Chemical abrasion is accomplished using a slurry to chemically weaken the surface of a wafer. Mechanical abrasion is accomplished using a polishing pad against which a wafer surface is pressed. Both the polishing pad and the wafer are rotated to cause the removal of surface material. The removed material is then washed over the edges of the polishing pads and into a drain by adding additional slurry.

CMP planarization produces a smooth, damage-free surface for subsequent device processing. It requires less steps than a deposition/etchback planarization and has good removal selectivity and rate control.

A first embodiment of the invention will be discussed in conjunction with

Figure 3A:
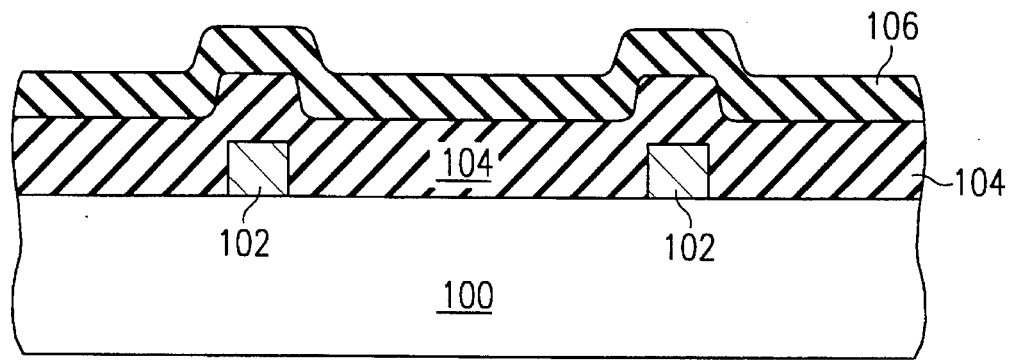

FIGS. 3a–d. FIG. 3a shows a semiconductor body 100 having topographical steps 102 formed thereon. Semiconductor body 100 may include transistors and the like formed therein. Topographical steps 102 may, for example represent metal interconnect lines as are standard in semiconductor devices. A first film 104 having a low removal rate is deposited over the structure. First film 104 has a thickness on the order of the height of step 102. For example, if step 102 had a height 4000–6000 Å, then first film 104 may have a thickness on the order of 2000–8000 Å. A second film 106 having a high removal rate with respect to the first film 104 is then deposited over the first film 104. The thickness of second film 106 is on the order of the thickness of first film 104.

Removal rate relates to the amount of material that may be removed by CMP from the surface of a semiconductor body in a given time. A particular CMP process polishing both a film with high removal rate and a film with low removal rate removes more of the high removal rate film than the low removal rate film, assuming all other factors are the same. Accordingly, in this embodiment, second film 106 can be removed at a faster rate than first film 104.

Multilayer films (first film 104 and second film 106) have compatible characteristics (i.e., they are able to meet all of the semiconductor requirements and are able to be layered over each other) and yet have significantly different CMP removal rates. These requirements can be met with in-situ deposited silicon dioxide layers having different removal rates. Differing removal rates can be achieved by either altering the doping between the two films or changing the stresses of the films as discussed in co-pending U.S. patent application Ser. No. 08/397,811, filed Mar. 3, 1995 and assigned to Texas Instruments, Inc.

TABLE I

| Film Properties | | Removal Rate | |
|---|---|---|---|
| Doping Conc. | Stress | Oxide on Metal | Field Oxide |
| Standard Undoped TEOS | −102 MPa | 1426.5 A/min | 606.3 A/min |
| Undoped TEOS | −35 MPa | 109.68% | 144.91% |
| Undoped TEOS | 67 MPa | 120.04% | 159.76% |
| BSG 2.74% | −102 MPa | 140.71% | 153.27% |
| BSG 3.19% | −132 MPa | 131.29% | 134.67% |
| PSG 3.15% | −135 MPa | 129.51% | 141.13% |
| PSG 3.34% | −187 MPa | 132.12% | 134.27% |

Table 1 shows the CMP removal rates for various dielectric films having varying dopant levels and tensile stresses. The data for the various films has been normalized to a standard undoped TEOS at a stress of −102 MPa. The removal rate is dependent on both dopant level and tensile stress. As can be determined from Table 1, a more positive stress increases removal rates.

TABLE 2

| Film Properties | | Step height |
|---|---|---|
| Doping Conc. | Stress | Reduction |
| Standard Undoped TEOS | −102 MPa | 820.2 A/min |
| Undoped TEOS | −35 MPa | 83.63% |
| Undoped TEOS | 67 MPa | 90.68% |
| BSG 2.74% | −102 MPa | 131.42% |
| BSG 3.19% | −132 MPa | 128.79% |
| PSG 3.15% | −135 MPa | 120.92% |
| PSG 3.34% | −187 MPa | 130.53% |

Table 2 shows the step height reduction for various dielectrics. The data is again normalized to a standard undoped TEOS film at a stress of −102 MPa. As shown in Table 2, the step height reduction can also be enhanced by using different stresses and/or different doping levels.

For the first embodiment, the second film 106 may comprise a film having more positive stress and/or higher dopant levels, such as a boron doped silicate glass (BSG) at a stress of −102 MPa. First film 104 may comprise a film having more negative stress such as BSG at −132 MPa and/or less or no doping, such as undoped TEOS at −102 MPa. The first film 104 and second film 106 may thus be tailored for a specific removal rate ratio.

Figure 1:
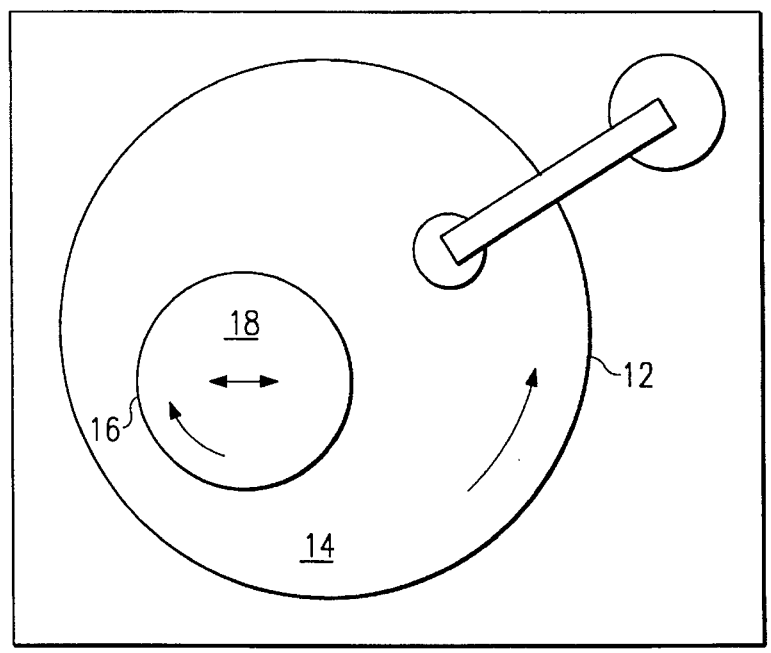
FIG. 1 is a block diagram of a prior art CMP system.
Figure 2:
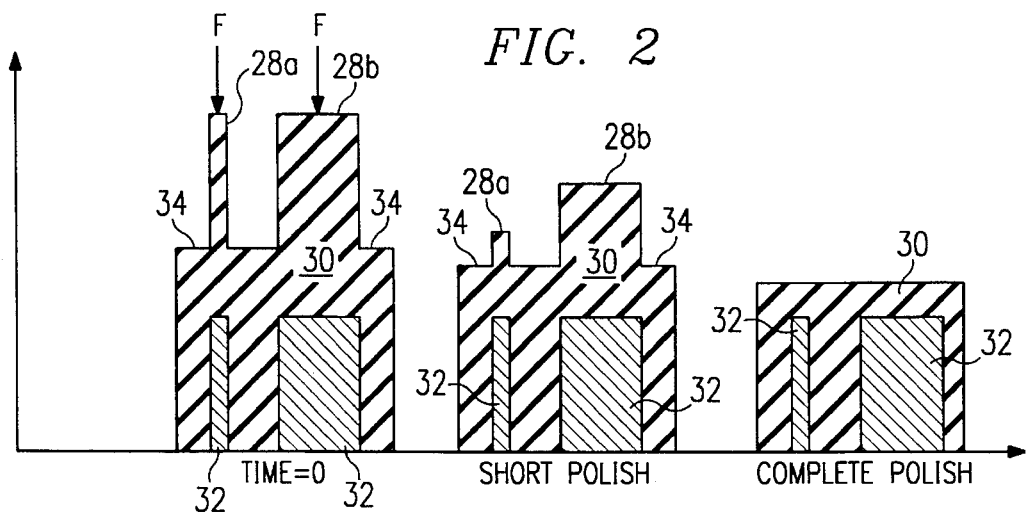
FIG. 2 is a cross-sectional diagram on a time axis illustrating a prior art CMP process.
Figure 3B:
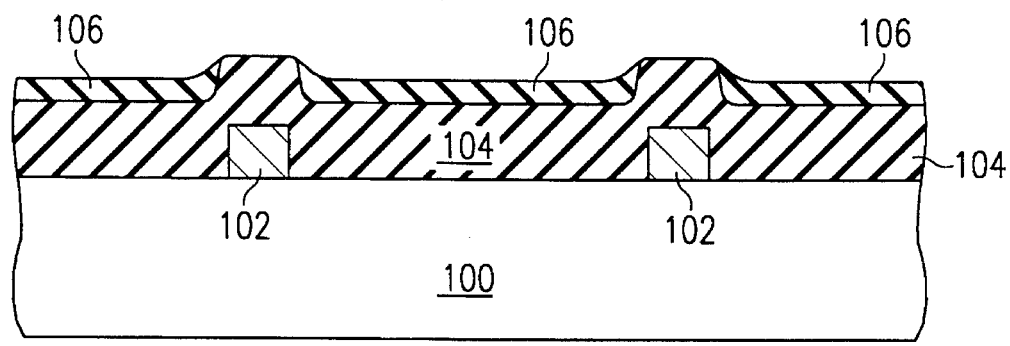
Figure 3C:
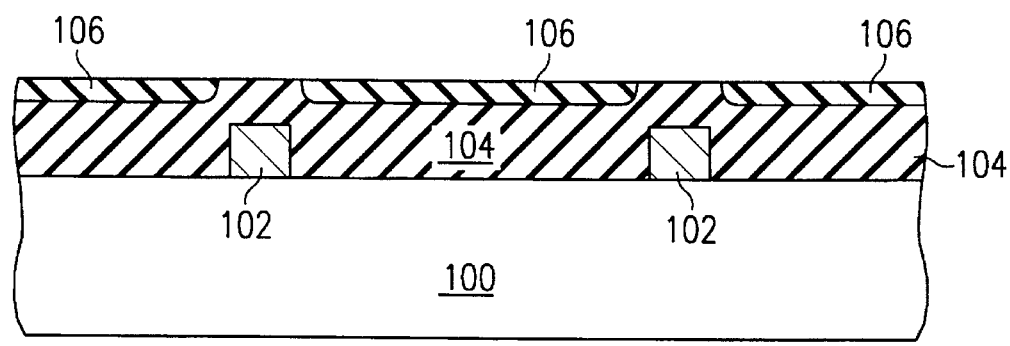

The structure of FIG. 3a is chemically-mechanically polished using the desired CMP equipment. For example, the CMP machine described in co-pending U.S. patent application Ser. No. 08/209,816, filed Mar. 1, 1994 and assigned to Texas Instruments, Inc. may be used or conventional CMP machines such as the one shown in FIG. 1 may be used. The CMP polish rate is constant throughout the thickness of the film, however, the polish rate on top of the steps 102 are higher due to higher pressure on those areas. The mechanical component in CMP follows the law, P=F/A (pressure equals force divided by area). Since the force is constant in CMP, pressure varies with that area in which the polishing pad contacts the surface of the semiconductor body 100. Because the pressure applied by the CMP equipment increases as the area decreases, second film 106 will be removed at a faster rate over steps 102 than over the field 110, as shown in FIG. 3b. The second film 106 having a higher removal rate reduces the time required for this part of the process. Accordingly, the portion of first film 104 over step 102 is reached while second film 106 remains over the field areas 110.

Figure 3D:
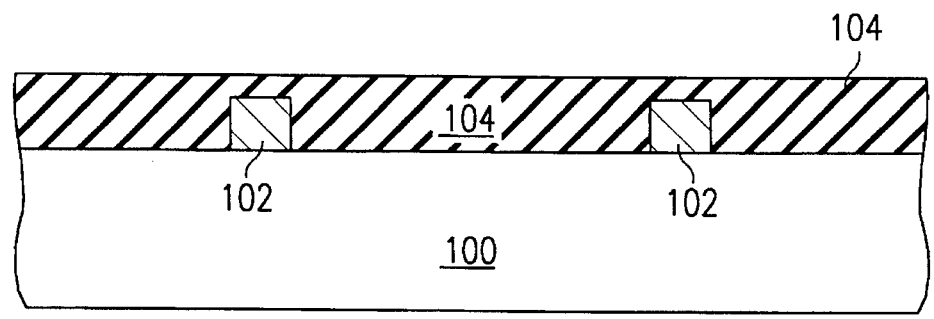

Because first film 104 has a lower removal rate than second film 106, the removal of material over steps 102 slows down. First film 104 over steps 102 may effectively act as a polish stop at this point, resulting in the structure shown in FIG. 3c. However, if first film 104 has a thickness greater than the height of steps 102, CMP may continue until all of the second film 106 is removed from field areas 110 as shown in FIG. 3d. This embodiment has better uniformity and process latitude than a normal single film CMP process while requiring less time to complete due to the higher CMP rate on the top layer.

A second embodiment of the invention will be described in conjunction with FIGS. 4a–c. FIG. 4a shows a semiconductor body 130 having topographical steps 132 formed thereon. Topographical steps 132 may, for example represent metal interconnect lines as are standard in semiconductor devices. A first film 134 having a high removal rate is deposited over the structure. First film 134 preferably has a thickness greater than the height of step 132. For example, if step 132 had a height 4000–6000 Å, then first film 104 preferably has a thickness greater than 6000 Å. A second film 136 having a low removal rate with respect to the first film 134 is then deposited over the first film 134. The thickness of second film 136 is on the order of one half the thickness of first film 134.

The structure of FIG. 4a is then chemically-mechanically polished using the desired CMP equipment. Because the pressure applied by the CMP equipment increases as the area decreases, second film 136 will be removed at a faster rate over steps 132 than over the field 140, as shown in FIG. 4b. Accordingly, the portion of first film 134 over step 132 is reached while second film 136 remains over the field areas 140.

Because first film 134 has a higher removal rate than second film 106, the removal of material over steps 102 increases related to material removed in field areas 140 and the height of the step 132 is reduced at a faster rate than with prior art methods. Thus, the surface of the structure is planarized as shown in FIG. 4c in less time than with prior art methods. Although not shown, a portion of second film 106 may remain over field areas 140 depending on the thickness of the original films 104 and 106 and the amount of CMP polishing. Furthermore, this embodiment has better uniformity and process latitude than a normal single film CMP process because the amount of material removed over the field areas 140 can be better controlled.

Figure 5A:
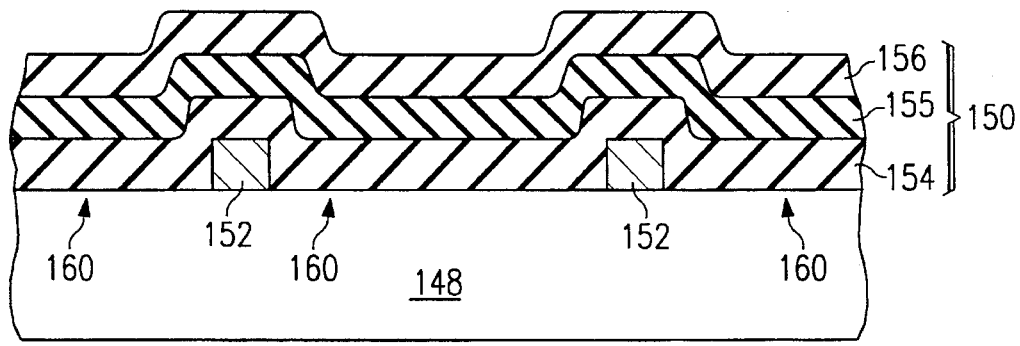
Figure 5B:
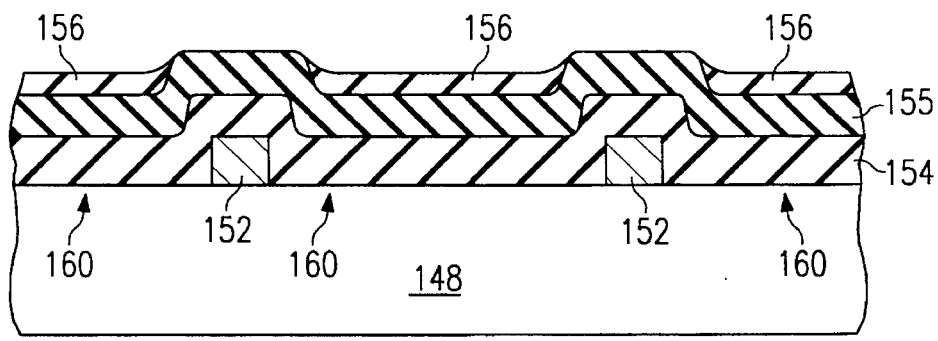
Figure 5C:
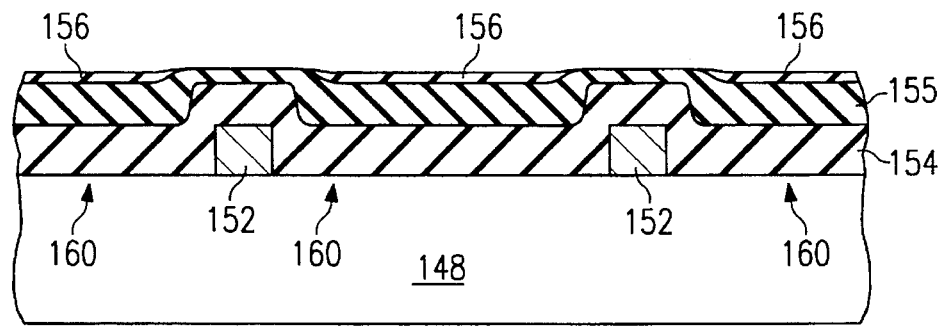

A third embodiment of the invention will be discussed in conjunction with FIGS. 5a–c. FIG. 5a shows a multilayer film 150 having three layers (154, 155, and 156). First layer 154 is deposited over a semiconductor body 148 having steps and field areas 160. First film 154 has a low removal rate similar to the first embodiment. First film 154 has a thickness on the order of the height of step 152. A second film 155 having a high removal rate with respect to the first film 154 is then deposited over the first film 154. The thickness of second film 155 is on the order of the thickness of first film 154. A third film 156 is then deposited over the second film 155. The third film also has a low removal rate similar to the first film 154.

The structure of FIG. 5a is then chemically-mechanically polished using the desired CMP equipment. Because the pressure applied by the CMP equipment increases as the area decreases, third film 156 will be removed at a faster rate over steps 152 than over the field 160, as shown in FIG. 5b. Accordingly, the portion of second film 155 over step 152 is reached while third film 156 remains over the field areas 160. Because the second film 155 has a higher removal rate, the step height reduced due to the fact that low removal rate material (third film 156) remains over the field, as shown in FIG. 5c. The second film 155 having a higher removal rate reduces the time required for this part of the process.

Figure 5D:
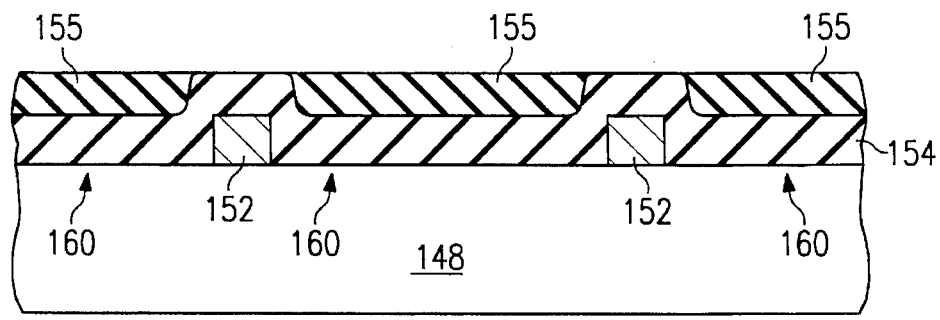

CMP continues as all of the second film 155 is removed over steps 152 and all of the third film 156 is removed from the field area 160. Because first film 154 has a lower removal rate than second film 155, the first film 154 acts as a polish stop over steps 152, as shown in FIG. 5d. The first film 154 increases the process tolerance over the prior art as well as over the first and second embodiments described above. First film 154 also aids in controlling the process. For example, polish non-uniformities could be better tolerated using the third embodiment. Having first film 154 over steps 152 act as a polish stop enables longer polishes to account for other parts of the wafer to continue to be polished due to non-uniformities in the polish. This is illustrated in FIG 6. If the CMP machine itself had non uniformities such that one area 162 of semiconductor body 148 was polished faster that another area 164. The existence of first film 154 allows for a longer polish which in turn allows area 164 to be planarized to area 162. In addition, the amount of film material left over the structure will be more uniform across a wafer and wafer-to-wafer. This is very important when further processing is need, such as forming vias and forming multi-level interconnects.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description It is therefore intended that the appended claims encompass any such modification, or embodiments.

What is claimed is:

1. A method for chemical-mechanical polishing of a semiconductor body having topographical steps on a surface thereof, comprising the steps of:

depositing a first film having a first removal rate over the surface of said semiconductor body;

depositing a second film having a second removal rate over said first film, wherein said second removal rate is not equal to said first removal rate;

depositing a third film having a third removal rate over said second film, wherein said third removal rate is not equal to said second removal rate;

chemically-mechanically polishing said semiconductor body such that initially said second film is exposed only over said topographical steps and then after further polishing said first film is initially exposed only over said topographical steps, and continuing said chemically-mechanically polishing step until said semiconductor body has a planarized surface.

2. The method of claim 1, wherein said first removal rate is greater than said second removal rate.

3. The method of claim 2, wherein said first film comprises a material having a more positive tensile stress than said second film.

4. The method of claim 2, wherein said first film comprises a material having a higher dopant concentration that said second film.

5. The method of claim 1, wherein said second removal rate is greater than said first removal rate.

6. The method of claim 5, wherein said second film comprises a material having a more positive tensile stress than said first film.

7. The method of claim 5, wherein said second film comprises a material having a higher dopant concentration that said first film.

8. The method of claim 1, wherein said third removal rate and said first removal rate are less than said second removal rate.

9. A method for planarizing the surface of a semiconductor body having topographical steps and field areas located thereon, comprising the step of:

forming a multi-layer interlevel dielectric over the surface of said semiconductor body comprising the steps of forming a first layer having a first removal rate, forming a second layer having a second removal rate different from said first removal rate and forming a third layer having a third removal rate over the second layer; and chemically-mechanically polishing said multi-layer interlevel dielectric to planarize the surface of the semiconductor body, wherein the second layer is initially exposed over the topographical steps while the third layer remains over the field areas such that polishing increases over the topographical steps and then subsequently, as polishing continues, the first layer is exposed over the topograghical steps while the second layer remains over the field areas such that polishing decreases over the topographical steps.

10. The method of claim 9, wherein said first removal rate is greater than said second removal rate and wherein said chemical-mechanical polishing step exposes said first layer over said topographical step while said second layer remains over the field areas such that polishing increases over said topographical steps when said first layer is exposed.

11. The method of claim 10, wherein said chemical-mechanical polishing steps creates a planarized surface having said second layer over said field areas and said first layer over said topographical steps.

12. The method of claim 9, wherein said second removal rate is greater than said first removal rate and wherein said chemical-mechanical polishing step exposes said first layer over said topographical steps while said second layer remains over the field areas such that polishing slows down over said topographical steps when said first layer is exposed.

13. The method of claim 12, wherein said chemical-mechanical polishing steps creates a planarized surface having said first layer over said field areas and said topographical steps.

14. The method of claim 12, wherein said first layer is a polish stop for said chemically-mechanically polishing step.

* * * * *